United States Patent [19]

Kaufman

[11] 4,218,724

[45] Aug. 19, 1980

[54] COMPACT CIRCUIT PACKAGE HAVING IMPROVED CIRCUIT CONNECTORS

[76] Inventor: Lance R. Kaufman, 131 White Oak Way, Mequon, Wis. 53092

[21] Appl. No.: 962,588

[22] Filed: Nov. 21, 1978

[51] Int. Cl.² .............................................. H05K 1/14
[52] U.S. Cl. .................................... 361/395; 361/399; 361/412; 339/17 M
[58] Field of Search .................... 339/17 M, 17 N; 361/380, 386, 426, 395, 392, 399, 412, 415

[56] References Cited

U.S. PATENT DOCUMENTS

| | | | |
|---|---|---|---|
| 3,323,022 | 5/1967 | Da Costa | 361/412 |
| 3,437,883 | 4/1969 | Smith | 361/412 |
| 3,579,046 | 5/1971 | Jordan | 361/412 |
| 3,599,046 | 8/1971 | Spreitzer | 361/412 |
| 3,805,117 | 4/1974 | Hausman | 361/395 |
| 3,934,177 | 1/1976 | Horbach | 361/399 |
| 4,144,555 | 5/1979 | McGalliard | 361/386 |

*Primary Examiner*—Gerald P. Tolin
*Attorney, Agent, or Firm*—Andrus, Sceales, Starke & Sawall

[57] ABSTRACT

A circuit package has an inverted receptacle-like housing with a base plate and a depending peripheral wall. Upper and lower substrates are spaced within the housing with the major elements including lead frame elements and thick film conductor circuits on the facing surfaces. The upper substrate, typically containing control circuitry, is mounted along the under side of the base plate while the lower substrate, typically containing power circuitry, closes the receptacle and forms a heat sink for the circuit package. Lead frame extensions within power input and output circuitry project from the lower substrate and protrude through openings within the upper surface of the base plate. In addition, lead frame extensions within the control circuitry on the first substrate likewise protrude through the base plate openings. In certain instances, lead frame extensions from both of the substrates are commonly located in the same opening and operatively provide electrical coupling between the two substrates. In certain instances, terminal plugs are removeably connected to one or more lead frame extensions located within said base plate openings for external electrical connections.

11 Claims, 7 Drawing Figures

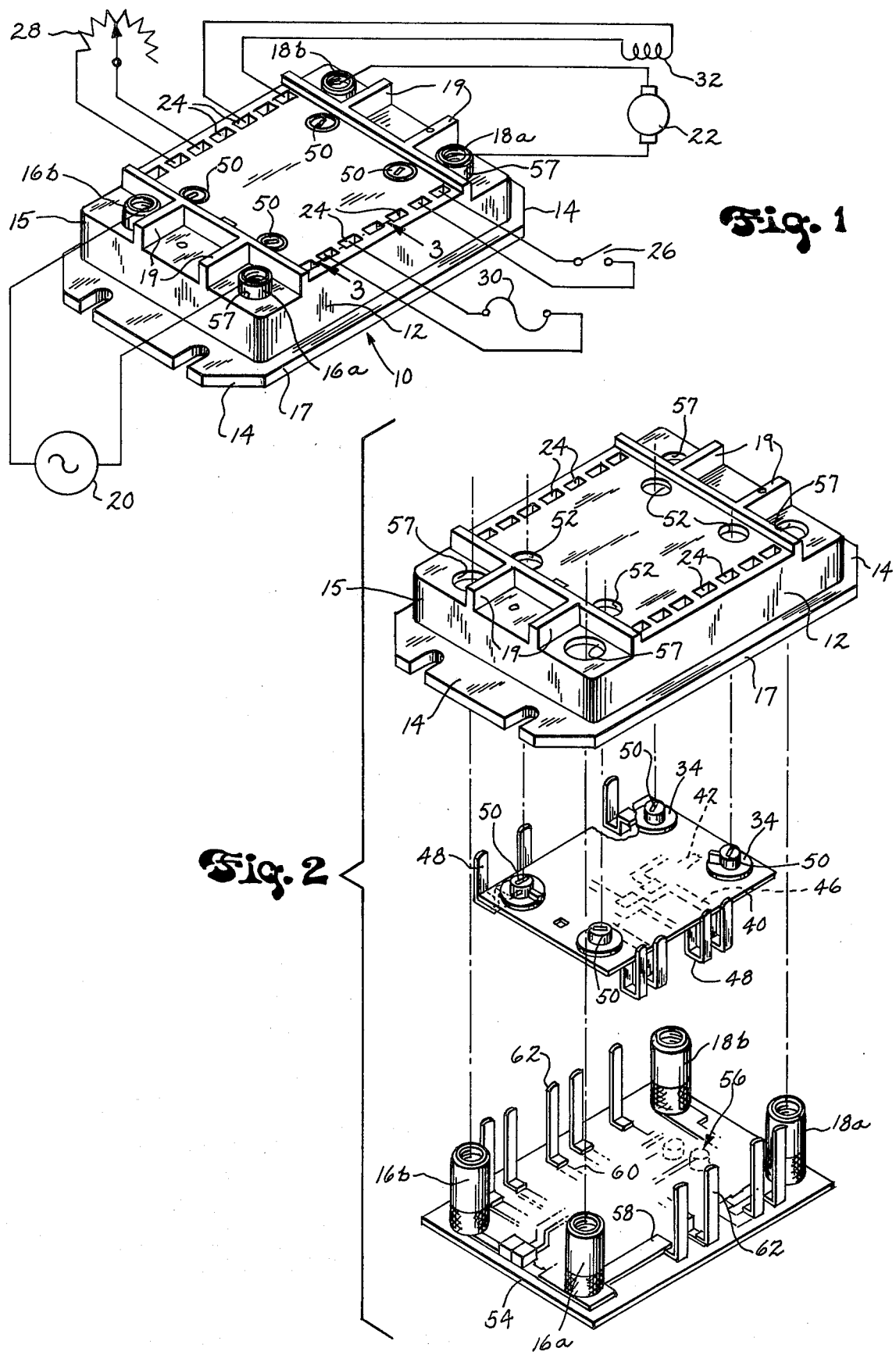

COMPACT CIRCUIT PACKAGE HAVING IMPROVED CIRCUIT CONNECTORS

BACKGROUND AND SUMMARY OF THE PRESENT INVENTION

The present invention relates to a circuit package for electrical components which facilitates both internal and external connection of the circuitry contained therein as well as the dissipation of heat. The package also exposes control elements such as adjustable potentiometers, power terminals, and auxiliary terminals, on one side of the package while providing a heat sink on the other side, thereby facilitating the mounting of the package in an enclosure or other suitable mounting arrangement. In these respects, the circuit package of the present invention represents a substantial improvement over prior art packages such as that shown in U.S. Pat. No. 3,805,117.

Briefly, the circuit package of the present invention has a receptacle-like housing of plastic or other insulating material. The receptacle has a base plate with a depending peripheral wall. An upper substrate is positioned on the underneath side of the base plate and includes film circuits and other elements on its lower side. A lower substrate with film circuits and other elements facing the upper substrate closes the peripheral wall and forms a heat sink for the circuitry. Typically the circuitry on the lower substrate will comprise power circuitry.

Power input and output lead frame extensions extend from the lower substrate and protrude through terminal openings within the upper surface of the base plate of the housing. In like manner, lead frame extensions of the upper substrate also protrude through the terminal openings within the upper surface of base plate. In certain instances, a lead frame extension within a base plate opening is removably joined to a terminal plug for an external electrical connection. In other instances, lead frame extensions from both the upper and lower substrates are located within a common base plate opening and are joined for forming an electrical connection between the upper and lower substrate circuits and possibly to a terminal plug for an external electrical connection.

BRIEF DESCRIPTION OF THE DRAWING

FIG. 1 is a perspective view of the circuit package of the present invention with certain associated elements shown in schematic form.

FIG. 2 is an exploded perspective view of the circuit package of the present invention.

DETAILED DESCRIPTION OF THE PREFERRED EMBODIMENT

Figure 7:
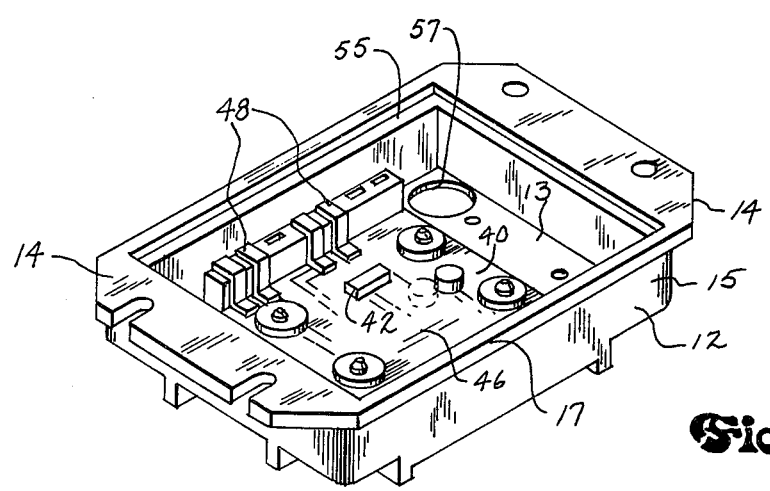
FIG. 7 is a perspective view of the housing of the circuit package in an inverted position.

Turning now to FIG. 1, the circuit package of the present invention is identified by the numeral 10. Circuit package 10 includes a housing 12, hereinafter described in detail, containing flanges 14 for mounting circuit package 10 to a heat dissipating element or other supporting structure. As shown in the inverted view of FIG. 7, housing 12 includes a base plate 13 surrounded by a peripheral wall 15 terminating in a rim 17 which includes the flange 14.

Returning to FIG. 1, the circuitry in package 10 typically includes a power circuit used to energize an electrical load and a control circuit for controlling load energization. The power circuit of circuit package 10 contains a pair of input terminals 16a and 16b, and a pair of output terminals 18a and 18b. The terminals 16 and 18 preferably comprise cylindrical studs embraced by barriers 19, as shown in FIGS. 1 and 2. Circuit package 10 is shown in FIG. 1 as having input terminals 16 connected to an a.c. power supply 20 for converting the alternating current to direct current at output terminals 18 for energizing d.c. motor 22. A plurality of auxiliary terminals 24, described in detail below, are also provided in circuit package 10. Terminals 24 are connected to controls such as on-off switch 26, speed rheostat 28, and fuse 30, or auxiliary loads, such as motor field winding 32.

The exploded perspective view of FIG. 2 shows the internal construction of circuit package 10 of the present invention. Included in the circuit package is a first substrate 40 which may be formed of ceramic or other non-conductive material. Substrate 40 has circuitry 42 mounted on the lower surface thereof when the substrate is viewed as in FIG. 2. Circuitry 42 may comprise a plurality of components connected through thick film conductors 46. Circuitry of this type is shown in applicant's earlier U.S. Pat. No. 3,958,075. Leads 48 forming portions of the lead frame extend from the periphery of substrate 40.

Figure 3:
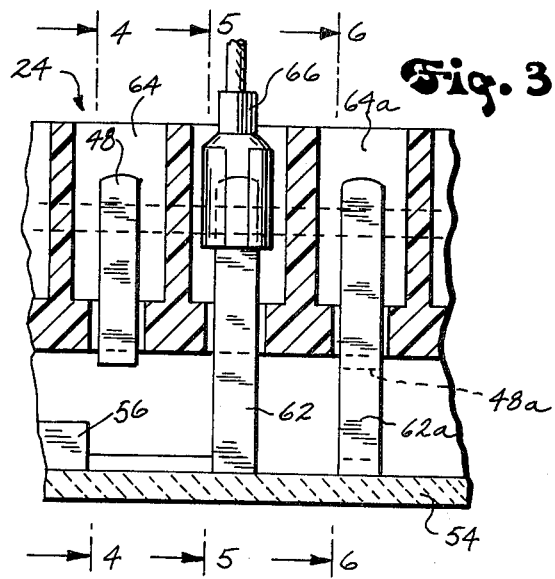
FIG. 3 is a partial cross-sectional view taken along the line 3—3 of FIG. 1 showing means for making external auxiliary connections to the circuit package.
Figure 4:
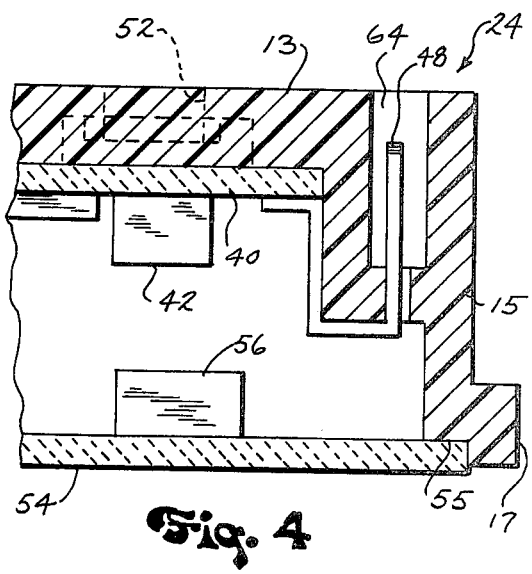
FIG. 4 is a cross-sectional view of the connection means taken along the line 4—4 of FIG. 3.
Figure 5:
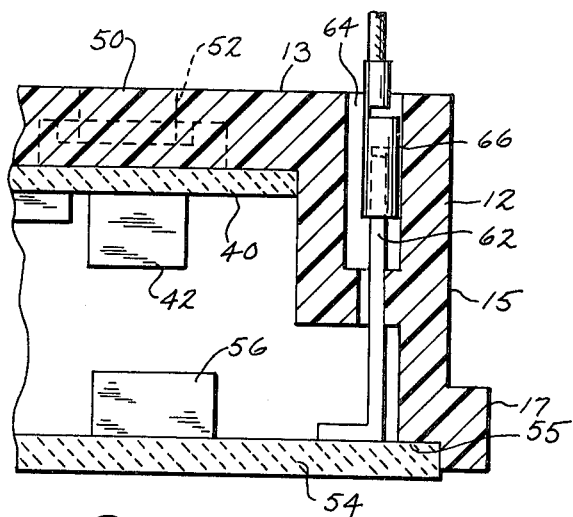
FIG. 5 is a cross-sectional view taken along the line 5—5 of FIG. 3.
Figure 6:
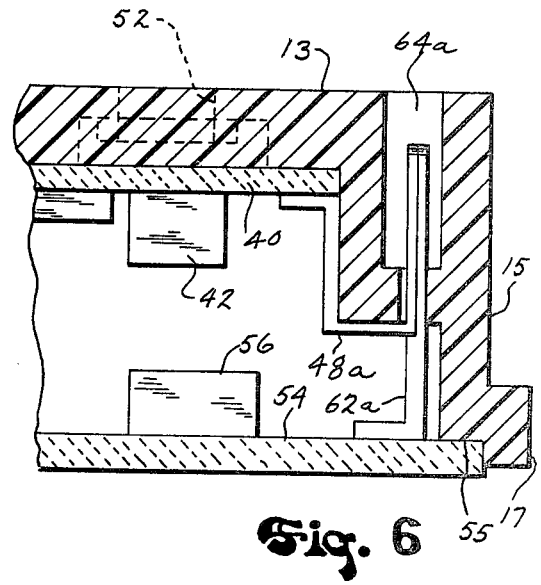
FIG. 6 is a cross-sectional view taken along the line 6—6 of FIG. 3.

Substrate 40 also carries elements such as potentiometers including variable knobs 50 which may be adjusted with a screw driver or other tool to control the operation of circuitry 42. As shown in FIGS. 5 and 6, substrate 40 abuts the exposed interior surface of base plate 13 of housing 12 with potentiometer knobs 50 extending through holes 52 in housing 12. Circuitry 42 may comprise the control circuitry of the package.

A second substrate 54 is also mounted in housing 12 and may contain the power circuitry 56 of the package. To this end, the studs comprising the power circuit terminals 16 and 18 are mounted on substrate 54 through lead elements 58 which, in turn, are connected to various thick film conductors 60. The components and connections of power circuitry 56 are mounted on the upper surface of substrate 54 when the substrate is viewed as in FIG. 2. Lead frame extensions 62 are formed to project outwardly near the peripheral edge of substrate 54. Substrate 54 is mounted in recess 55 extending about rim 17 of housing 12, as shown in FIGS. 5 and 6. The substrate 54 thus serves to close the opening of housing 12 and the externally exposed surface of substrate 54 may be mounted adjacent to a heat sink element for dissipating the heat generated from the power handling components of power circuitry 56. When substrate 54 is mounted in recess 55, input and output terminals 16 and 18 extend through holes 57 in housing 12 to permit the necessary connections.

FIGS. 3 through 6 show the details of the construction of cavity 24 of housing 12. Each of these cavities includes a recess 64 in housing 12. Lead frame extensions 48 from circuit 42 on substrate 40 are bent in a generally U-shaped configuration to extend from the underside of substrate 40 around the bottom surface of the wall forming the recesses 64 and upward into selected openings of the recesses 64 for providing terminals 48. See particularly FIG. 4 and FIG. 7.

The lead frame extensions 62 of circuit 56 on substrate 54 extend upwardly for insertion into other selected recesses 64 as shown in FIG. 5. FIG. 5 and the corresponding portion of FIG. 3 also show an external connector plug 66 which fits over the lead frame extensions 62 within opening 64 for coupling the circuit to the necessary external elements. The same type of connector plug can also be used with the lead frame extensions 48.

A unique feature of the present invention is the use of the lead frame extensions 48 and 62 as a means for making the necessary connections between the control circuitry 42 and the power circuitry 56. For this purpose, the lead frame extensions 48 and 62 may be inserted in the same recess or opening 64 and joined together, as shown in FIG. 6 in which the lead frame extensions 48a and 62a are inserted in the same opening 64a and soldered together. Preferably, the thickness of the lead frame extensions 48a and 62a is reduced through an etching process so that the combined thickness of the two lead frame extensions approximates that of a single lead frame extension 48 or 62. The lead frame connection shown in FIG. 6 may thus comprise both a means for connecting circuitries 42 and 56 together, as well as a means for external connection, as with connector 66. This configuration permits all of power terminals 16 and 18, auxiliary terminals 24 and potentiometer knobs 50 to be located on the upper surface of base plate 13.

To protect circuitries 42 and 56, and increase the mechanical strength properties of circuit package 10, the interior of housing 12 may be filled with a potting compound, such as epoxy resin, through the appropriate fill and vent holes in the housing after the assembly and testing of the circuit package is complete.

Various modes of carrying out the invention are contemplated as being within the scope of the following claims particularly pointing out and distinctly claiming the subject matter which is regarded as the invention.

I claim:

1. A circuit package comprising:
 a housing having a base plate surrounded by a peripheral wall to form a circuit receiving receptacle;
 a first substrate positioned in said receptacle with one side adjacent the interior side of said base plate and the other side containing electrical circuitry, said substrate having a first set of electrical leads comprising sheet-like lead frame extensions extending from said substrate;
 a second substrate positioned in said receptacle adjacent the rim of said peripheral wall and closing the receptacle of said housing, said second substrate being spaced from said first substrate in said housing and having circuitry on the side facing said first substrate, said second substrate having a second set of leads comprising sheet-like lead frame extensions extending from said substrate; and
 a plurality of recessed cells in said base plate extending through said base plate and opening on the exterior side thereof, selected leads of said first and second sets positioned within and surrounded by selected ones of said recessed cells to engage external connector means inserted in said cells for interconnection within external electrical circuits.

2. The circuit package according to claim 1 wherein other selected leads of said first and second sets are commonly positioned within selected ones of said recessed cells, said commonly located leads being electrically coupled for interconnecting the circuitries of said first and second substrates together and engageable with external connector means.

3. The circuit package according to claim 2 wherein the leads of said first and second sets comprise sheet-like lead frame extensions and wherein the thickness of the commonly connected lead frame extensions is reduced.

4. The circuit package according to claim 1 wherein at least one of said first and second substrates has power circuitry input and output terminals mounted thereon and protruding through said housing for permitting external power circuit connection to said circuit package.

5. The circuit package according to claim 4 wherein the circuitry on said second substrate comprises a power circuit and wherein said input and output terminals are mounted on said second substrate and protrude through the exterior side of said base plate.

6. The circuit package according to claim 5 wherein said input and output terminals comprise cylindrical stud-like terminals.

7. The circuit package according to claim 1 wherein the electrical circuitry on said first substrate has adjustable elements controlling the operation thereof and wherein said adjustable elements are mounted on the side of said first substrate adjacent said base plate and extend through said base plate to the exterior side thereof.

8. The circuit package according to claim 5 wherein the electrical circuitry on said first substrate has adjustable elements controlling the operation thereof and wherein said adjustable elements are mounted on the side of said substrate adjacent said base plate and extend through said base plate to the exterior side thereof.

9. The circuit package according to claim 1 wherein said second substrate closing the receptacle of said housing forms a heat sink for dissipating heat from said circuitries.

10. The circuit package according to claim 1 wherein the circuit of said package includes control circuitry and power circuitry and wherein said control circuitry is mounted on said first substrate and said power circuitry is mounted on said second substrate.

11. A package for a circuit including control circuitry and power circuitry, said package comprising:
 a housing including a base plate surrounded by a peripheral wall to form a circuit receiving receptacle;
 a first substrate positioned in said receptacle with one side adjacent the interior side of said base plate and the other side containing the control circuitry, said substrate having a first set of electrical leads extending from said substrate;
 a second substrate positioned in said receptacle adjacent a rim of said peripheral wall and closing the receptacle of said housing, said second substrate being spaced from said first substrate in said housing and having the power circuitry on a first side facing said first substrate and a heat transmitting second side oppositely disposed from said first side for dissipating heat from said circuitries, said second substrate having a second set of leads extending from said substrate, said power circuitry having power input and output terminals mounted thereon and protruding through the exterior side of said base plate; and a plurality of recessed cells in said base plate extending through said base plate and opening on the exterior side thereof, selected leads of said first and second sets positioned within and surrounded by selected ones of said recessed cells to engage external connector means inserted in said cells for interconnection within external electrical circuits, other selected leads of said first and second sets being commonly positioned within selected ones of said recessed cells, said commonly located leads being electrically coupled for interconnecting the circuitries of said first and second substrates together and engageable with external connector means inserted in said cells.

* * * * *